United States Patent [19]
Timm

[11] Patent Number: 5,635,867
[45] Date of Patent: Jun. 3, 1997

[54] HIGH PERFORMANCE DRIVE STRUCTURE FOR MOSFET POWER SWITCHES

[75] Inventor: Kenneth J. Timm, Rockwall, Tex.

[73] Assignee: Lucent Technologies Inc., Murray Hill, N.J.

[21] Appl. No.: 278,479

[22] Filed: Jul. 20, 1994

[51] Int. Cl.⁶ ............................................ H03K 17/04
[52] U.S. Cl. ......................... 327/427; 327/374; 327/382; 361/18
[58] Field of Search ................................ 327/108, 372, 327/374, 377, 382, 420, 434, 443, 502, 584, 111; 323/265, 311; 363/22, 24; 361/18

[56] References Cited

U.S. PATENT DOCUMENTS

| | | |
|---|---|---|
| 4,634,903 | 1/1987 | Montorfano . |
| 4,705,962 | 11/1987 | Kinoshita et al. ................. 327/427 |
| 4,748,351 | 5/1988 | Barzegar . |
| 4,767,952 | 8/1988 | Nollet ................................. 327/427 |
| 5,138,515 | 8/1992 | Bourgeois ........................... 361/18 |
| 5,303,128 | 4/1994 | Rozman .............................. 363/21 |

FOREIGN PATENT DOCUMENTS

| | | |
|---|---|---|
| 0 454 597 A1 | 10/1991 | European Pat. Off. . |
| 40 35 969 A1 | 1/1991 | Germany . |

*Primary Examiner*—Timothy P. Callahan
*Assistant Examiner*—Jung Ho Kim
*Attorney, Agent, or Firm*—John T. Rehberg

[57] ABSTRACT

A high performance isolated gate drive circuit for driving MOSFET is disclosed which uses a MOSFET pull-down device, provides unusually low gate discharge impedance, exceptionally fast turn-off of the controlled switch and reduced power dissipation in the overall gate drive circuit. It also provides superior off-time noise immunity.

3 Claims, 2 Drawing Sheets

HIGH PERFORMANCE DRIVE STRUCTURE FOR MOSFET POWER SWITCHES

FIELD OF THE INVENTION

This invention relates to MOSFET drive circuits and in particular a high performance isolated gate drive circuit.

BACKGROUND OF THE INVENTION

In zero voltage switching (ZVS) power converter topologies, for example, fast turn-off of the power MOSFET is very important. Power MOSFETs must be turned "off" before their drain-source capacitance is charged significantly by the current being commutated "off". Fast FET turn-on in ZVS power converter topologies is of lesser concern since self-commutation in the turn-on process is inherent in the operation of these topologies.

The possibility of spurious turn-on in high power MOSFET gate drive circuits becomes of increasing concern as switching speed and circuit power level grow, particularly in bridge-type topologies. High current switching paths and parasitic couplings from high voltage commutation injects spurious voltage spikes into the gate circuits. When the gates require the isolation provided by transformers, leakage inductances inherent in the windings increases the noise susceptibility problems as well as reduces switching speed. Under dynamic operational conditions instantaneous noise levels may rise sufficiently to turn the MOSFETs "on" at inappropriate times. Catastrophic circuit failure, primarily due to cross conduction, may then result.

SUMMARY OF THE INVENTION

A high performance isolated gate drive circuit for driving a MOSFET is disclosed which uses a MOSFET pull-down device, provides unusually low gate discharge impedance, exceptionally fast turn-off of the controlled switch and reduced power dissipation in the overall gate drive circuit. It also provides superior off-time noise immunity.

The high performance isolated gate drive minimizes gate drive circuit power dissipation and in so doing allows a compact, efficient circuit implementation. This new drive uses a drive MOSFET as the active pull-down device. This drive component is voltage rather than current driven and thus imposes much less loading of the source generator than would be the case for a bipolar drive transistor. During turn-off the drive MOSFET is turned on and automatically clamps the gate-source voltage of the power MOSFET.

DETAILED DESCRIPTION

Figure 1:
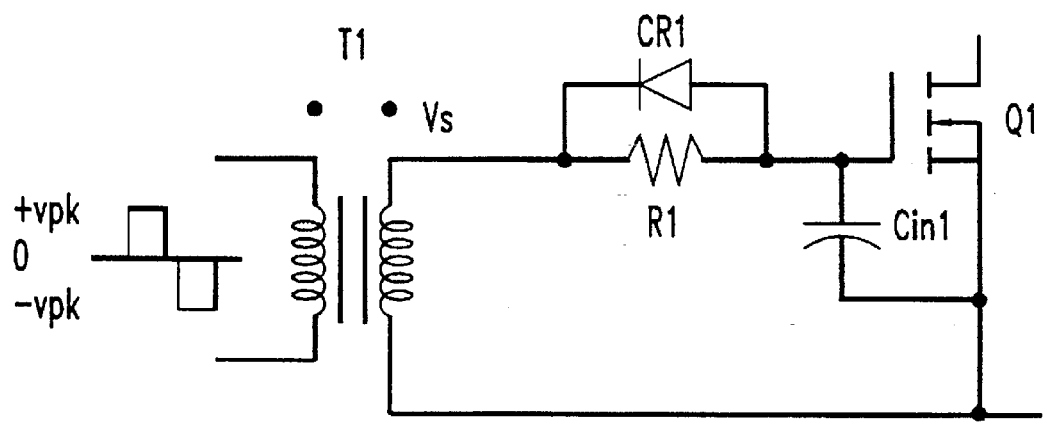
FIG. 1 is a schematic of a simple prior art gate driver for a power MOSFET switch.

FIG. 1 shows the schematic of a prior art gate-drive circuit. This circuit exhibits several of the following shortcomings. One shortcoming is that the gate voltage rise and fall times of the power MOSFET Q1 are slowed by the need to conduct the gate charge through the leakage reactance of the transformer T1. An excess of energy is wasted by driving the capacitance of Cin1 both positive and negative to the full extent of the input voltage waveform. The capacitance Cin1 is generally supplied by the gate source parasitic capacitance of the MOSFET Q1. If needed a discrete capacitance may be used for Cin1. In addition the drive circuit must be capable of sinking the turn-off current of the power MOSFET Q1.

The series resistor, R1, included in the drive circuit serves two purposes: it reduces the Q of the resonant circuit formed by the transformer leakage inductance and gate input capacitance Cin1. This reduction is required to minimize ringing of the gate-drive voltage signal. It serves to control EMI generation by slowing the turn-on time of power MOSFET Q1. This feature is not needed since this phenomenon is not an issue in resonant switching ZVS topologies.

To speed up the turn-off of power MOSFET Q1, a diode CR1 is placed in parallel with the resistor R1 to bypass is. While this does reduce turn-off time, the discharge current slew rate (di/dt) is limited by the leakage inductance of T1 through which it flows. Switching speed is still inadequate and to achieve further improvement active pull down must be utilized.

Figure 2:
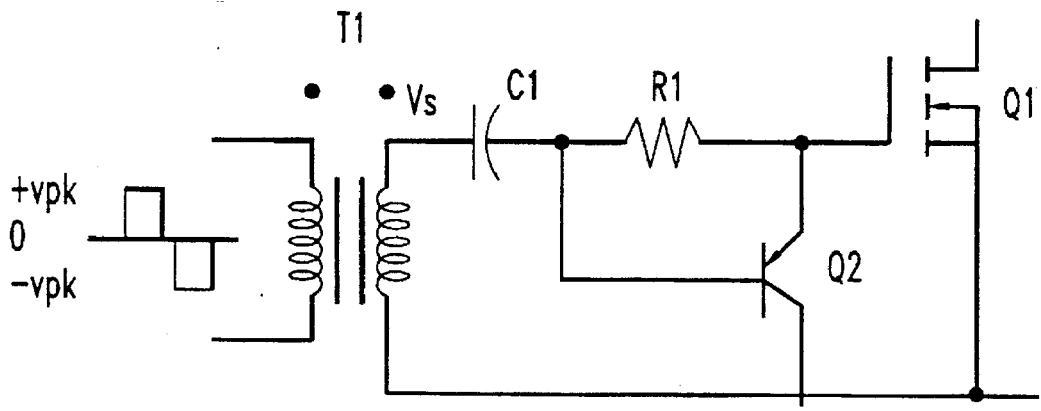
FIG. 2 is a schematic of prior art circuit using a bipolar transistor for driving a power MOSFET switch.

FIG. 2 illustrates a prior art drive circuit, using an active pull-down bipolar transistor Q2, to reduce switch-off time. This circuit also exhibits some design challenges as described below A bipolar transistor is a very nonlinear device, its current gain (hfe) is highly dependent on collector current. To turn power MOSFET Q1 "off" rapidly, a large pulse current (a few amps) needs to be conducted. A correspondingly large base current is required because of the reduced hfe. The drive circuits must be capable of supporting these large currents at the cost of larger devices and higher power dissipation. Storage times in a bipolar devices go up with increased current resulting in less than expected performance. A possibility of exceeding the bipolar transistor Veb(max) rating, the reverse bias piv, also exists. The value of R1 needs to be carefully chosen on the basis of conflicting device specifications and switching speed. Performanc usually falls short of what can be obtained by using the below circuitry of the invention.

Figure 3:
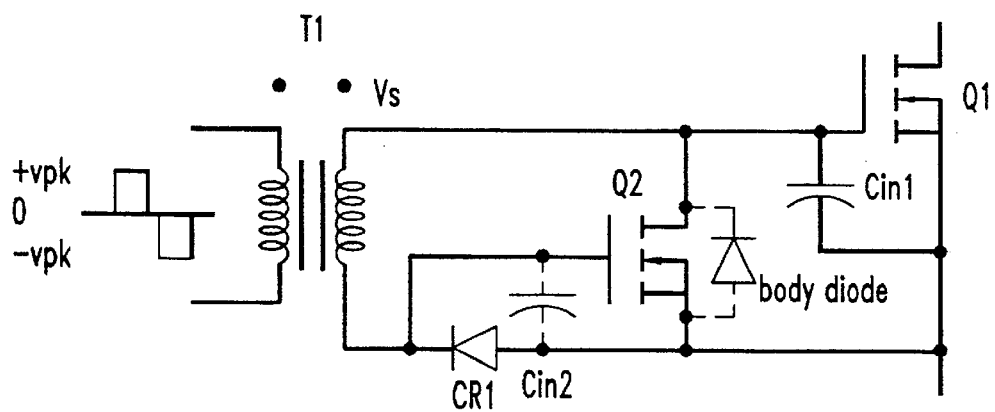
FIG. 3 is a schematic of a gate driver for a power MOSFET switch embodying the principles of the invention.

FIG. 3 shows a simplified diagram of a drive circuit embodying the principles of the invention. The primary and secondary transformer windings shown connected with dotted lines represent important parasitic components inherent in the physical structures of the devices.

The drive signal applied to the isolation transformer T1 is a rectangular, bipolar waveform, and has an amplitude fl typically 12 to 15 V. This signal is derived from a low impedance source, e.g. totem-pole connected MOSFETs. To maintain low impedance it is desirable to have tight coupling between the primary and secondary circuits. This can be accomplished with a unity turns ratio transformer and bifilar windings, if permissible. The drive waveform can be divided into three distinct regions: A first region has a positive polarity with an amplitude of +Vpk corresponding to Q1 being "on". A second region has a negative polarity with amplitude of −Vpk corresponding to Q1 being "off" and the gate-source impedance held low. A third region has a zero amplitude or "dead-time" occurring between the first and second regions and Q1 must be "off".

The drive MOSFET Q2 exhibits high transconductance (gm) for all operational conditions, draws no steady state gate current and imposes a minimum load on the gate driver circuits. It is therefore able to support large drain currents without incurring the base current load penalty imposed by bipolar transistor devices.

With positive voltage at the dotted ends of the transformer T1, a pulse of current flows in the gate circuit loop. This loop consists of the secondary of T1, the gate input capacitance of Q1 (Cin1) and diode CR1. Cin1 is charged to +Vpk turning power MOSFET Q1 "on" when Vgs(th) is reached. At this point, drive MOSFET Q2 is effectively out of the circuit.

Figure 4:
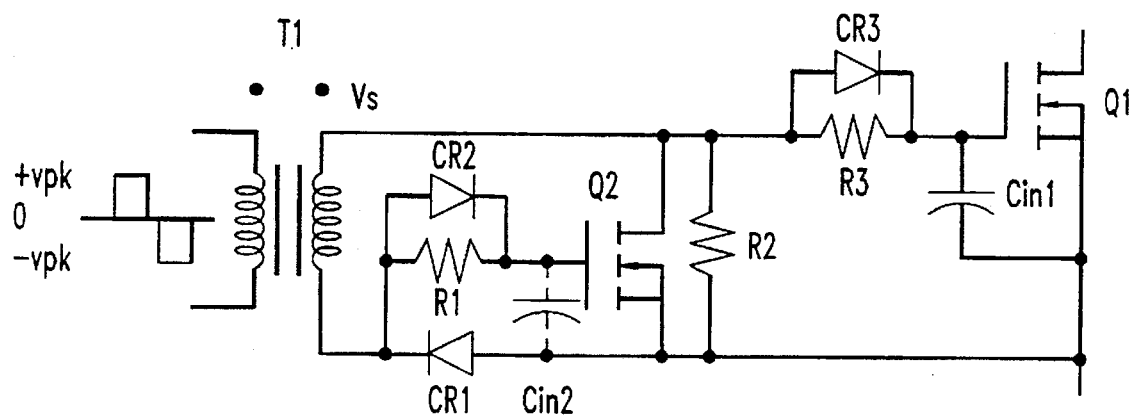
FIG. 4 is a schematic of a practical circuit implementation of a gate driver for a power MOSFET switch embodying the principles of the invention.

During the dead-time interval, which may be as little as 100 nS, power MOSFET Q1 must be "off". Capacitor Cin1 enters this time period with an initial voltage of +Vpk. When the transformer secondary voltage drops to zero at the beginning of the dead-time interval, the voltage on capacitor Cin1 causes charge to be transferred to capacitor Cin2. By design Cin1>>Cin2, so, while charge is shared between the two capacitors, there is little voltage droop and drive MOSFET Q2 turns "on" strongly. Since, drive MOSFET Q2's discharge path bypasses the leakage reactance of T1, the gate voltage of power MOSFET Q1 falls very rapidly towards Vgs(th)2. Drive MOSFET Q2 must be so chosen that its threshold voltage, Vgs(th)2<(Vgs(th)1. Failure to meet this requirement results in power MOSFET Q1 remaining "on" during the dead-time interval. This inequality can easily be dispensed with by using the actions of resistor R1 and diode CR1 to facilitate the energy storage capabilities of capacitor Cin2 as shown in the below described practical circuit implementation (FIG. 4).

Negative voltage at the transformer dots turns power MOSFET Q1 "off". The transient current pulse flows through drive MOSFET Q2 and capacitor Cin1 again bypassing the transformer leakage inductance which no longer affects the turn-off equation. As long as negative polarity is maintained, the transformer secondary voltage appears across drive MOSFET Q2's gate-source and the MOFSET is "on". Initially, the negative polarity appears on drive MOSFET Q2's source via its body diode. When drive MOSFET Q2 turns "on" it goes into a very low impedance state limited only by its $rds_{on}$ specification thus linking the dotted side of the transformer to the device source. During this time diode CR1 is reversed biased preventing drive MOSFET Q2's positive gate bias from being shorted out.

I claim:

1. A gate drive circuit for a power MOSFET having a drain, a source and a gate electrode, comprising:

a drive transformer having a secondary winding connected to apply a source-gate voltage to the power MOSFET and charge a capacitance shunting the source-gate electrodes of the power MOSFET;

a drive MOSFET having a drain, a source and a gate electrode and the drain electrode directly connected to a first terminal of the secondary winding and its source electrode coupled to a second terminal of the secondary winding and being operative when conducting to clamp a gate voltage of the power MOSFET and discharge the capacitance shunting the source-gate electrodes of the power MOSFET;

drive circuitry energized through the secondary winding connected for controlling conductivity of the drive MOSFET and including a diode connecting a source electrode of the drive MOSFET to the second terminal of the secondary winding, and a capacitance shunting the source-gate electrodes of the drive MOSFET;

and wherein the capacitance shunting the source-gate electrodes of the power MOSFET is a discreate capacitor.

2. A gate drive circuit for a power MOSFET having a drain, a source and a gate electrode, comprising:

a drive transformer having a secondary winding connected to apply a source-gate voltage to the power MOSFET and charge a capacitance shunting the source-gate electrodes of the power MOSFET;

a drive MOSFET having a drain, a source and a gate electrode and the drain electrode directly connected to a first terminal of the secondary winding and its source electrode coupled to a second terminal of the secondary winding and being operative when conducting to clamp a gate voltage of the power MOSFET and discharge the capacitance shunting the source-gate electrode of the power MOSFET;

drive circuity energized through the secondary winding connected for controlling conductivity of the drive MOSFET and including a diode connecting a source electrode of the drive MOSFET to the second terminal of the secondary winding, and a capacitance shunting the source-gate electrodes of the drive MOSFET;

and wherein the capacitance shunting the source-gate electrodes of the drive MOSFET is a discrete capacitor.

3. A gate drive circuit for a power MOSFET having a drain, a source and a gate electrode, comprising:

a drive transformer having a secondary winding connected to apply a source-gate voltage to the power MOSFET and charge a capacitance shunting the source-gate electrodes of the power MOSFET;

a drive MOSFET having a drain, a source and a gate electrode and the drain electrode directly connected to a first terminal of a secondary winding and its source electrode coupled to a second terminal of the secondary winding and being operative when conducting to clamp a gate voltage of the power MOSFET and discharge the capacitance shunting the source-gate electrodes of the power MOSFET;

drive circuitry energized through the secondary winding connected for controlling conductivity of the drive MOSFET and including a diode connecting a source electrode of the drive MOSFET to the second terminal of the secondary winding, and a capacitance shunting the source-gate electrodes of the drive MOSFET;

and further including circuitry having a parallel connected diode and resistor connecting the gate electrode of the drive MOSFET to the secondary winding.

* * * * *